United States Patent
Satou et al.

(10) Patent No.: US 9,258,935 B2
(45) Date of Patent: Feb. 9, 2016

(54) BOARD PROCESSING APPARATUS

(71) Applicant: YAMAHA HATSUDOKI KABUSHIKI KAISHA, Shizuoka-ken (JP)

(72) Inventors: Toshimichi Satou, Shizuoka (JP); Atsushi Okada, Shizuoka (JP)

(73) Assignee: Yamaha Hatsudoki Kabushiki Kaisha, Shizuoka-ken (JP)

(*) Notice: Subject to any disclaimer, the term of this patent is extended or adjusted under 35 U.S.C. 154(b) by 128 days.

(21) Appl. No.: 13/736,764

(22) Filed: Jan. 8, 2013

(65) Prior Publication Data
US 2013/0180103 A1 Jul. 18, 2013

(30) Foreign Application Priority Data

Jan. 12, 2012 (JP) ................. 2012-004219

(51) Int. Cl.
*B23P 19/00* (2006.01)
*H05K 13/04* (2006.01)

(52) U.S. Cl.
CPC ....... *H05K 13/0404* (2013.01); *Y10T 29/53174* (2015.01)

(58) Field of Classification Search
CPC .......... H05K 13/0061; H05K 13/0069; H05K 2203/163; H05K 13/0015; Y10T 83/141; Y10T 83/536; Y10T 83/6571; Y10T 29/53091; Y10T 29/53261; Y10T 408/52

USPC ............................ 29/739–741, 743, 786, 794
See application file for complete search history.

(56) References Cited

U.S. PATENT DOCUMENTS

| 5,855,059 A | 1/1999 | Togami et al. |
| 6,725,532 B1 | 4/2004 | Okada et al. |

FOREIGN PATENT DOCUMENTS

| CN | 1167317 C | 9/2004 |
| JP | H09-102696 A | 4/1997 |
| JP | 2009-111421 A | 5/2009 |

OTHER PUBLICATIONS

An Office Action issued by the Korean Patent Office on Dec. 27, 2013, which corresponds to Korean Patent Application No. 10-2013-0002909 and is related to U.S. Appl. No. 13/736,764; with English language partial translation.

*Primary Examiner* — Thiem Phan (74) *Attorney, Agent, or Firm* — Studebaker & Brackett PC (57) ABSTRACT

Provided is a board processing apparatus which includes a head unit for performing a predetermined operation for a board, and a moving device for moving the head unit in a uniaxial direction, wherein the moving device includes a guide rail and a sliding member that is moved along the guide rail. The head unit is fixed to the sliding member in such a manner that at least a portion of the head unit protrudes outwardly from an edge face of the sliding member oriented in a moving direction thereof.

9 Claims, 7 Drawing Sheets

BOARD PROCESSING APPARATUS

BACKGROUND OF THE INVENTION

1. Field of the Invention

The present invention relates to a board processing apparatus for performing various operations for a board.

2. Description of the Background Art

Generally, a process of mounting various electronic components onto a board includes a plurality of work operations (for example, a solder printing operation of printing cream solder on a board, a component mounting operation of attaching electronic components onto the board, a soldering operation of heating the board with the electronic components mounted thereonto to solder the electronic components onto the board, an inspection operation of inspecting a result of each of the operations, etc.). Such operations for a board are performed using various board processing apparatuses, such as a solder printing machine, a component attaching machine, a reflow furnace and an inspection machine.

As a board processing apparatus, there has been known one type which includes a head unit for performing a predetermined operation for a board, and a moving device for moving the head unit along a guide rail in a uniaxial direction. However, in this moving device, a movement of the head unit is limited within a laying range of the guide rail, so that a region out of the laying range (a region outward of an axial edge face of the guide rail) has to be a dead space around the head unit.

Therefore, in order to eliminate such a dead space around the head unit, for example, a board processing apparatus described in JP 2009-111421A is provided with a two-tiered moving device. The two-tiered moving device includes a first trajectory defining section and a second trajectory defining section each having a guide rail extending in an X-axis direction. The first trajectory defining section is kept at a predetermined position without any movement in the X-axis direction, and the second trajectory defining section is moved in the X-axis direction along the first trajectory defining section. Further, the head unit is moved in the X-axis direction along the second trajectory defining section. In the two-tiered moving device, the second trajectory defining section is moved to a position where it protrudes outwardly from an edge face of the guide rail of the first trajectory defining section, and the head unit is moved to an end of the guide rail of the second trajectory defining section, so that the head unit can reach a position outward of the edge face of the guide rail of the first trajectory defining section.

However, the two-tiered moving device configured to move the second trajectory defining section and the head unit independently requires complicate control. In this regard, there is a need for improvement.

SUMMARY OF THE INVENTION

It is an object of the present invention to provide a board processing apparatus capable of moving a head unit to a position where it protrudes outwardly from an edge face of a guide rail, without a need for complicate control.

In order to achieve this object, according to one aspect of the present invention, there is provided a board processing apparatus which includes: a head unit for performing a predetermined operation for a board; and a moving device for moving the head unit in a uniaxial direction, wherein the moving device includes a guide rail and a sliding member that is moved along the guide rail, and wherein the head unit is fixed to the sliding member in such a manner that at least a portion of the head unit protrudes outwardly from an edge face of the sliding member oriented in a moving direction thereof.

DESCRIPTION OF THE PREFERRED EMBODIMENTS

With reference to FIGS. 1 to 7, the present invention will now be described in detail, based on one embodiment thereof. A board processing apparatus according to this embodiment is a component mounting apparatus 10 designed to pick up an electronic component (not illustrated) from a component supply section 11 and mount the electronic component onto a board (not illustrated) conveyed to a predetermined position (mounting station). The component mounting apparatus 10 includes a head unit 50 for transferring an electronic component from the component supply section 11 to the mounting station and performing a mounting operation (predetermined operation). The head unit 50 is provided in a plural number (in this embodiment, four). For example, each of the four head units 50 can perform a mounting operation for a respective one of four boards set on a base 12, or two or more of the four head units 50 can simultaneously perform a mounting operation for one or two boards set on the base 12. The following description will be made on an assumption that a direction parallel to a board conveyance direction of a board, a direction orthogonal to the board conveyance direction, and an up-down (vertical) direction, are an X-axis direction (X-direction), a Y-axis direction (Y-direction), and a Z-axis direction (Z-direction), respectively.

The base 12 of the component mounting apparatus 10 is provided with a conveyer 13 (see FIG. 2) capable of conveying a board and stopping the board at a predetermined position. The conveyer 13 is provided in two pairs (in a total number of four), wherein the two pairs of conveyers 13 are arranged in an approximately central region of the base 12 in its width direction (Y-direction). Thus, a board conveyance path can be formed in a lane number of one or two. Specifically, in the case of a large-size board, a width between one of the two pairs of conveyers 13 is narrowed, and a width between the other pair of conveyers 13 is widened. Then, the board is placed on the pair of widened conveyers 13. In this way, a plurality of the boards can be conveyed in a line. In the case of a small-size board, the board is placed on each of the two pairs of conveyers 13. In this way, a plurality of the boards can be conveyed in two lines.

The component supply section 11 is a wholly exchangeable carriage that is freely movable, and detachably provided in an attaching/detaching space S on each of both sides (in FIG. 1, right and left sides) of the two pairs of conveyers 13. A large number of component feeders 14 for supplying electronic components such as ICs, transistors and capacitors are set in each of the component supply sections 11. The component supply section 11 attached to the attaching/detaching space S has an upper side covered by a non-illustrated openable and closable cover. When the openable and closable cover is opened during an operating state of the component mounting apparatus 10, the operation is stopped as an emergency measure.

The component mounting apparatus 10 includes two frames 20 provided above the conveyers 13 to extend in the Y-direction in spaced-apart relation to each other by a predetermined distance, and an arm 30 (moving device) provided between the two frames 20 to extend in an X-direction. The head unit 50 is attached to the arm 30.

The arm 30 is movable in the Y-direction along the frames 20, and the head unit 50 is movable in the X-direction along the arm 30. Therefore, the head unit 50 is adapted to be freely horizontally movable in the X and Y-directions.

The arm 30 is supported by a corresponding one of the frames 20 in a cantilever manner (in a state in which one end of the arm 30 is engaged with the frame 20, and the other end is a free end), and provided in a pair with respect to each of the frames 20, i.e., in a total number of four. One of the arms 30 supported by one of the frames 20 to extend from the frame 20 toward a center of the base 12, and one of the remaining arms 30 supported by the other frame 20 in the same manner, are disposed in opposed relation to each other across the center of the base 12. In the following description, a combination of a pair of arms 30 consisting of the arm 30 supported by the one frame 20 and the arm 30 supported by the other frame 20 will be referred to as "pair of opposed arms 30A (first moving device), 30B (second moving device)". A protruding dimension of each of the arms 30 from the frame 20 is set to prevent respective free ends of the arms 30 from coming into contact with each other when the pair of opposed arms 30A, 30B are aligned in the X-direction.

Each of the arms 30 is freely movable in the Y-direction along the frame 20 according to driving of a linear motor. As the linear motor, a magnet plate 21 composed of a fixed permanent magnet is attached to an inner surface of the frame 20, and a movable unit 31 composed of a plurality of coils is attached to a base end of the arm 30. Further, as a linear guide, each of the frames 20 is provided with a pair of upper and lower Y-directional rails 22 each extending over the overall length thereof, and the arm 30 is provided with a pair of Y-directional sliders 32 each movable along a respective one of the Y-directional rails 22 while being fitted on the Y-directional rail 22.

The base 12 has a plurality of mark installation portions 15 provided at respective positions and each adapted to allow a columnar-shaped mark member (not illustrated) marked with a common recognition mark to be standingly installed therein. Each of the mark installation portions 15 is a concave portion concavedly formed in a circular shape. Two or more of the mark installation portions 15 are arranged outward of the two pairs of conveyers 13 (see FIG. 2). The mark installation portion 15 is provided in a number of four with respect to each of the two pairs of conveyers 13, wherein the four mark installation portions 15 are aligned along the pair of conveyers 13, and two of the four mark installation portions 15 located in an X-directional central region are located just below a gap defined between the free ends of the pair of opposed arms 30A, 30B.

Figure 4:
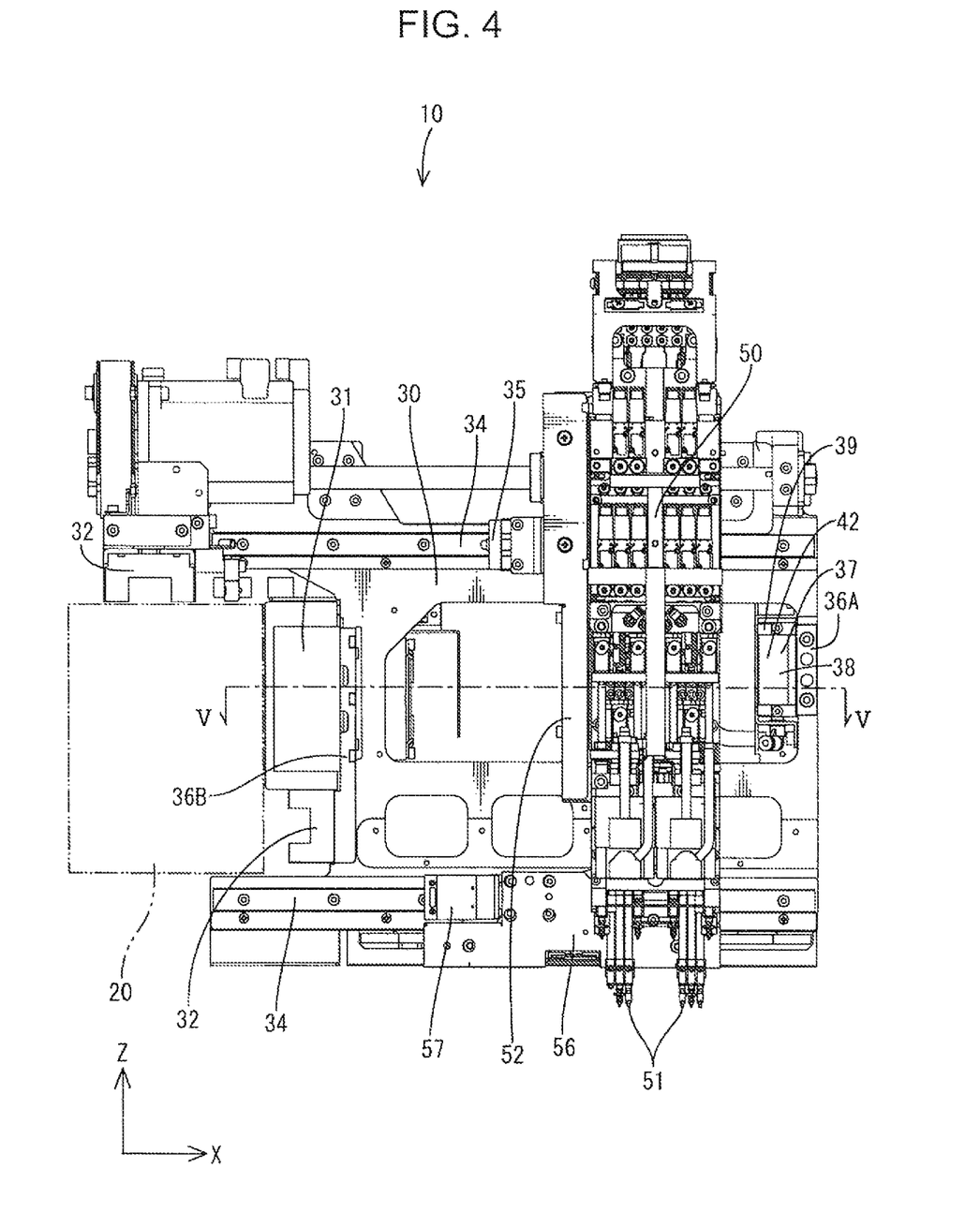
FIG. 4 is a side plan view of the arm and the head unit.

Each of the head units 50 has a plurality of suction nozzles 51 each capable of picking up or mounting an electronic component. Each of the suction nozzles 51 is moved downwardly during an operation of picking up or mounting an electronic component, and rotated about a vertical axis thereof in conformity to an orientation for picking up or mounting the electronic component. A plurality of (in this embodiment, two) lines each consisting of two or more (in this embodiment, six) of the suction nozzles 51 aligned in the X-direction are arranged side-by-side in the Y-direction. As illustrated in FIG. 4, the suction nozzles 51 are divided into two halves, and each of the halves is disposed at a position close to a respective one of widthwise opposite ends of the head unit 50. Each of the suction nozzles 51 is moved upwardly and downwardly according to driving of the linear motor, individually.

Although the following description will be made primarily about one of the arms 30, the same can be applied to the remaining arms 30.

The head unit 50 is provided with a base plate 52 on the side of a back surface thereof (on the side of the arm 30). The base plate 52 is formed in an approximately rectangular plate shape covering approximately the entirety of the back surface of the head unit 50, and a vertical dimension of the base plate 52 is set to be approximately equal to the overall height of the arm 30 (see FIG. 3).

Figure 5:
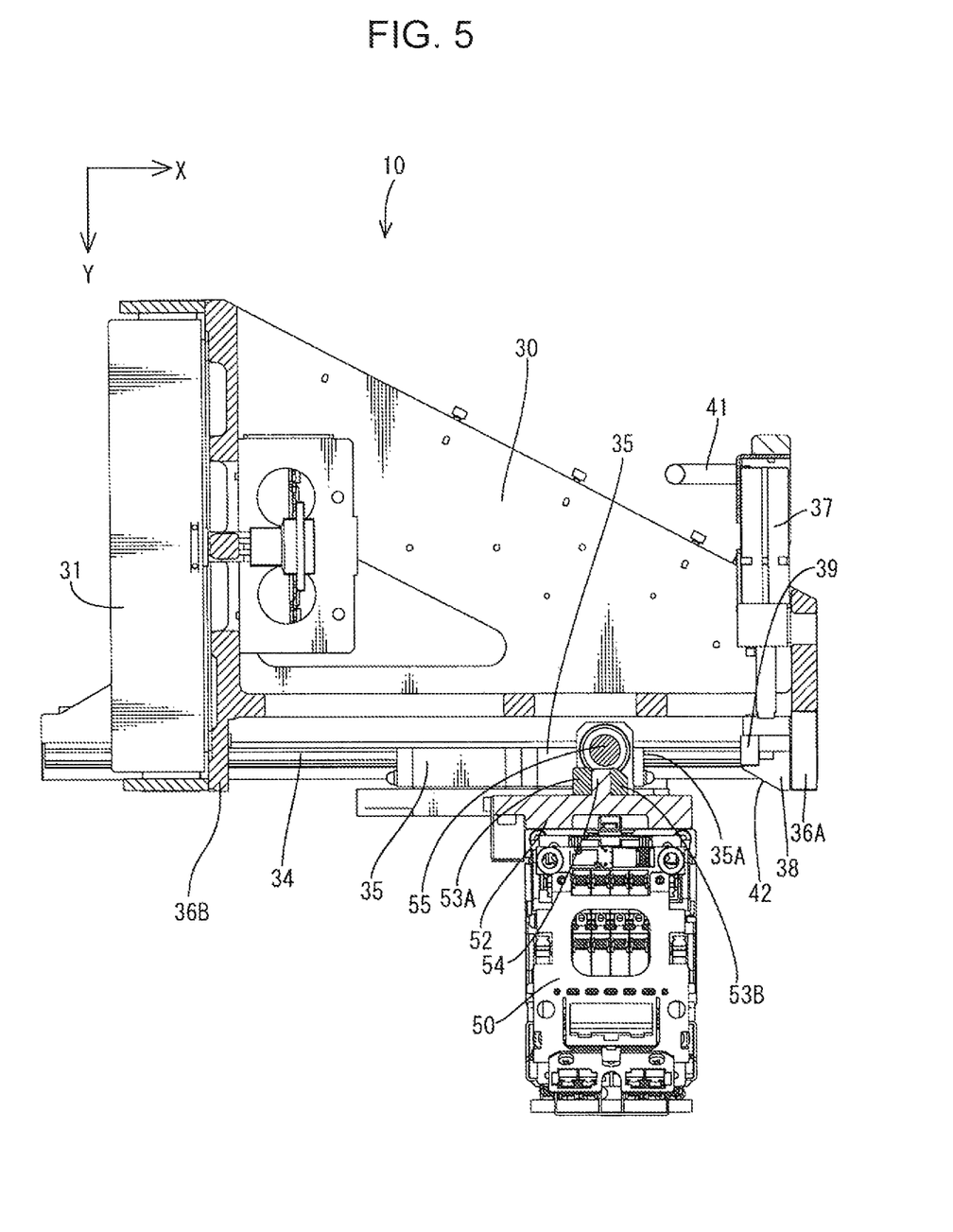
FIG. 5 is a sectional view taken along the line V-V, which illustrates a state in which a movable stopper is at a movement restricting position.

As illustrated in FIG. 5, a pair of dampers (hereinafter referred to respectively as "first damper 53A" and "second damper 53B") are provided on the side of a back surface of the base plate 52. The pair of dampers 53A, 53B are provided, respectively, on both sides of a protrusion 54 protrudingly provided approximately at a widthwise center of the head unit 50, while sandwiching the protrusion 54 therebetween. Each of the pair of dampers 53A, 53B is composed of a member made of urethane, and provided correspondingly to a respective one of a pair of aftermentioned stoppers 36A, 36B. Each of the pair of dampers 53A, 53B is not necessarily made of urethane, but may be a rubber member or a spring.

Further, a shaft 55 is provided on the side of the back surface of the base plate 52. The shaft 55 has opposite ends each attached to the base plate 52 through a bearing, so that it is rotatably supported by the base plate 52. The shaft 55 is located approximately at the widthwise (X-directional) center of the head unit 50, and provided backward of the pair of dampers 53A, 53B. The shaft 55 is formed in a vertically-extending elongate columnar shape having a length dimension falling between afterementioned upper and lower X-directional rails 34. The shaft 55 is disposed between the upper and lower X-directional rails 34 at a position vertically overlapping the upper and lower X-directional rails 34.

Figure 1:
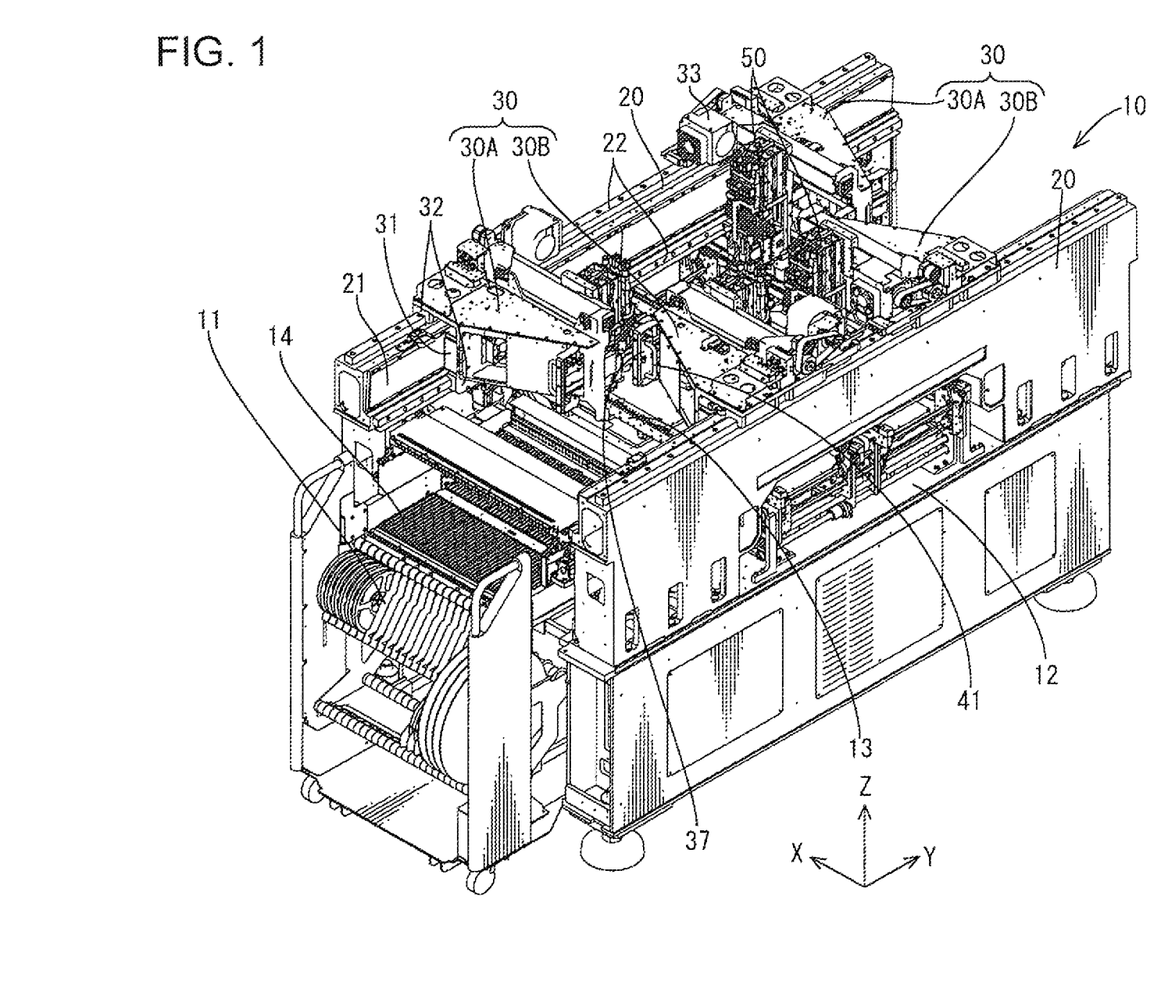
FIG. 1 is a perspective view illustrating an exterior appearance of a component mounting apparatus as a board processing apparatus according to one embodiment of the present invention.
Figure 2:
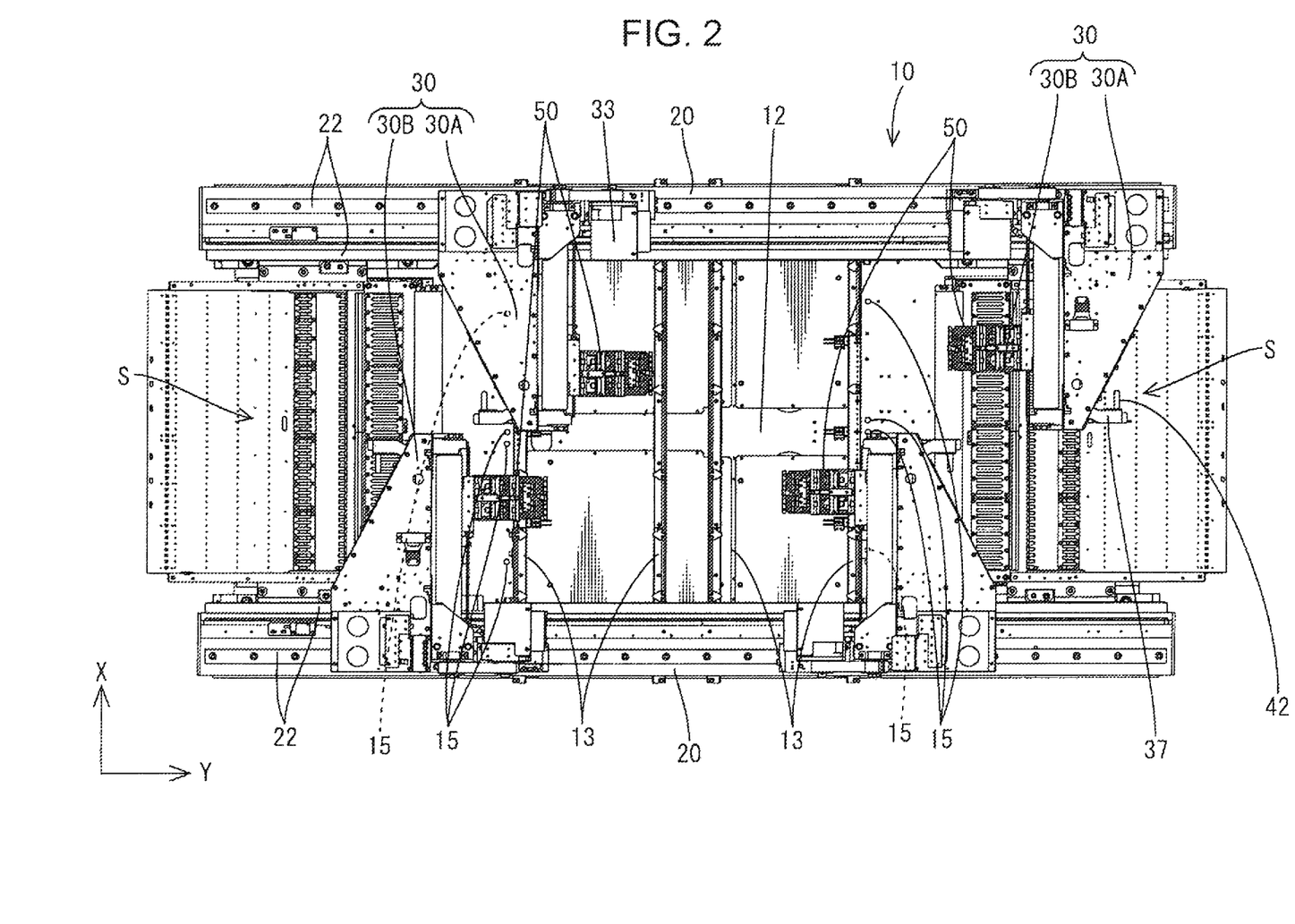
FIG. 2 is a top plan view of the component mounting apparatus.
Figure 3:
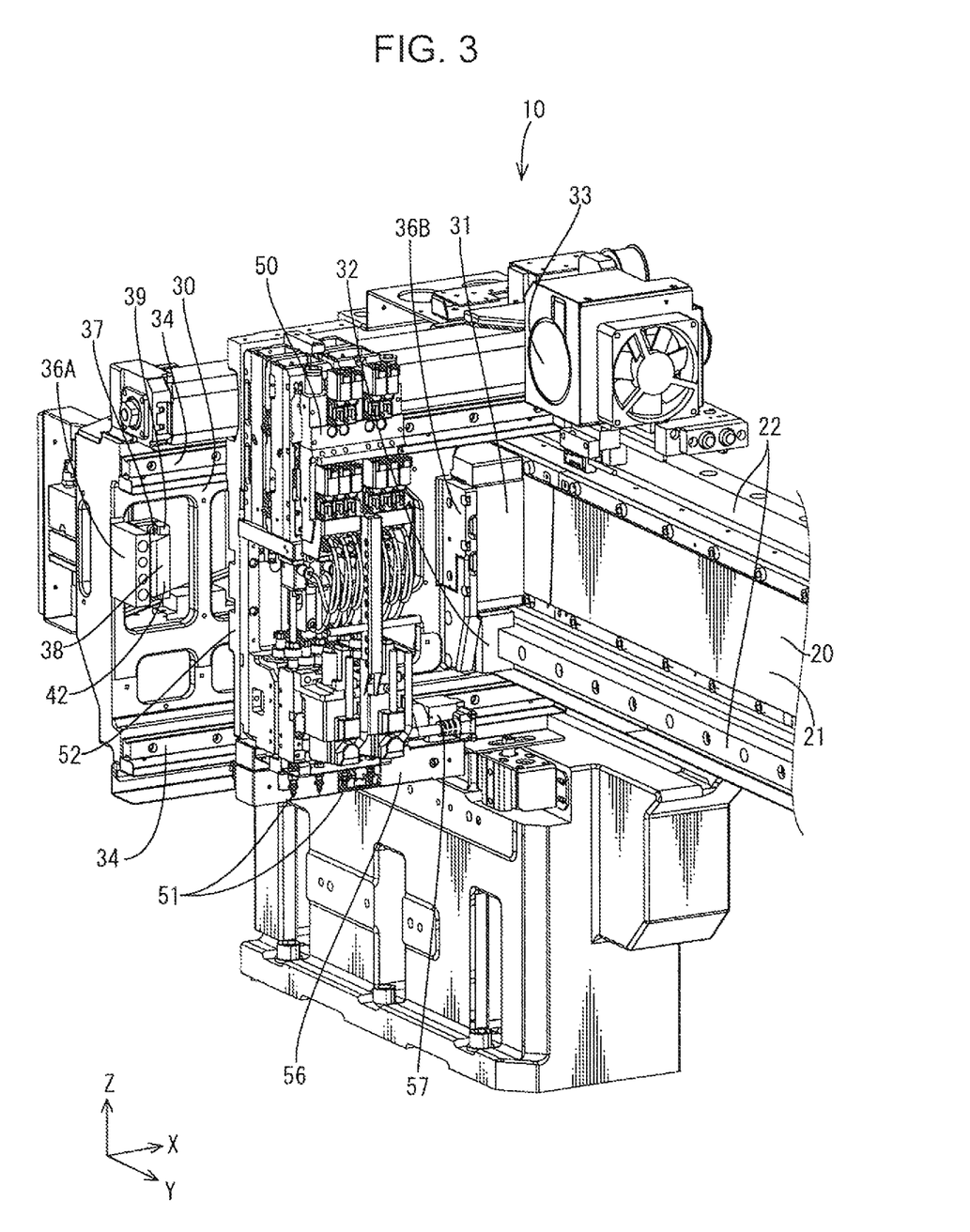
FIG. 3 is a perspective view of an arm and a head unit provided in the component mounting apparatus.

The head unit 50 is provided with a mark recognition device 56 for recognizing the common recognition mark of the base 12, and a reference mark (not illustrated) of a board. As illustrated in FIG. 3, the mark recognition device 56 is fixed to a lower end of the head unit 50 (a portion of the head unit 50 located below the base plate 52), so that it can be moved in the X and Y-directions together with the head unit 50. The mark recognition device 56 is generally formed in an elongate box shape in the width direction of the head unit 50. The mark recognition device 56 has one end protruding from a lateral surface of the head unit 50 toward the frame 20, and the other end disposed at a position conforming to the lateral surface of the head unit 50. The mark recognition device 56 is provided with a CCD camera 57 at an end thereof on the side of the frame 20. An image just below opposite ends of the mark recognition device 56 in its longitudinal direction can be taken by using the CCD camera 57 and a plurality of non-illustrated mirrors.

The head unit 50 is freely movable in the X-direction along the arm 30 according to driving of a ball screw. The arm 30 is provided with a ball screw shaft extending in the X-direction, and a servomotor 33 for driving the ball screw shaft. The arm 30 is further provided with an X-directional rail 34 (guide rail), and an X-directional slider 35 (sliding member) adapted to be movable along the X-directional rail 34 while being fitted on the X-directional rail 34.

As illustrated in FIG. 4, the X-directional rail 34 is provided in a pair one above the other, in such a manner that each of them extends approximately over the X-directional overall length of the arm 30. The upper X-directional rail 34 is located above the frame 20, and the lower X-directional rail 34 is located below the frame 20. Each of the upper and lower X-directional rails 34 extends across the inner surface (lateral surface) of the frame 20. The one end of each of the upper and lower X-directional rails 34 is located at the inner surface of the frame 20, and the other end of that has an edge face which reaches approximately the same X-directional position as a lateral surface of the arm 30 on the side of the free end thereof.

The X-directional slider 35 is provided in a number of two with respect to each of the upper and lower X-directional rails 34, wherein the two X-directional sliders 35 are combined as a X-directional slider set. Each of the X-directional sliders 35 is formed in a cross-sectionally approximately angular C shape fittable on a corresponding one of the X-directional rails 34 and in an elongate shape in conformity to the X-directional rail 34. In the X-directional slider set, the two X-directional sliders 35 are arranged in contact with each other in an extending direction of the X-directional rail 34. Each of the X-directional sliders 35 is movable along a corresponding one of the X-directional rails 34 over its entire length to an extent that an edge face of the X-directional slider 35 oriented in a moving direction (longitudinal direction) thereof does not protrude from an edge face of the X-directional rail 34. A total longitudinal length dimension of the successively-arranged X-directional slider set 35 is set to a value slightly greater than a width dimension of the base plate 52.

As illustrated in FIG. 5, the head unit 50 is fixed to the X-directional slider 35 (a connected body of the two X-directional sliders 35) at a position offset toward the free end of the arm 30 in the X-directional slider 35. Consequently, a portion of the head unit 50 protrudes outwardly from one 35A of opposite edge faces 35 of the X-directional slider 35 located on the side of the free end of the arm 30. More specifically, a widthwise approximately central position of the head unit 50 is fixed to a vicinity of an end of the X-directional slider 35, and a portion of the head unit 50 slightly less than a widthwise half thereof, i.e., a region of the head unit 50 including the group of suction nozzles 51 disposed on the side of a widthwise one end of the head unit 50 (a part of the suction nozzles), protrudes outwardly from the edge face 35A of the X-directional slider 35.

As illustrated in FIG. 4, the arm 30 is provided with a pair of fixed stoppers 36A, 36B disposed in spaced-apart relation to each other in the X-direction by a predetermined distance. One of the pair of fixed stoppers 36A, 36B is provided on the side of the free end of the arm 30 (this fixed stopper will hereinafter be referred to as "first fixed stopper 36A"), and the other fixed stopper is provided on the side of the base end of the arm 30 (this fixed stopper will hereinafter be referred to as "second fixed stopper 36B"). Each of the fixed stoppers 36A, 36B is formed in a vertically (Z-directionally) long approximately rectangular plate shape, and the second fixed stopper 36B has a length dimension greater than that of the first fixed stopper 36A. The first fixed stopper 36A has an upper edge face approximately equal to that of the second fixed stopper 36B in terms of a height position. The first fixed stopper 36A is provided at a position offset toward the upper X-directional rail 34. The first fixed stopper 36A has a lateral surface approximately flush with the lateral surface of the arm 30 and the edge face of each of the X-directional rails 34 (approximately equal to them in terms of a position in the X-direction). The second fixed stopper 36B is provided in adjacent relation to the movable unit 31.

The arm 30 has a movable stopper 37 provided on the side of the free end thereof and adapted to be relatively movable in the Y-direction with respect to the arm 30. The movable stopper 37 is arranged in adjacent relation to an inner side (base-end side) of the first fixed stopper 36A, and formed in a generally Y-directionally long shape (see FIG. 5). The movable stopper 37 is relatively moved in the Y-direction with respect to the arm 30, between a movement restricting position (see FIG. 5) where it protrudes into a movable range of the head unit 50 to restrict the movement of the head unit 50, and a movement permitting position where it is retracted from the movable range of the head unit 50 to permit the movements of the head unit 50 (see FIG. 6).

The movable stopper 37 includes a stopper member 38 that is provided on the side of a Y-directional end thereof and protrudes between the upper and lower X-directional rails 34 when the movable stopper 37 is moved to the movement restricting position. The stopper member 38 is provided with a damper (hereinafter referred to as "third damper 39"). The third damper 39 is composed of a member made of urethane and formed in an elongate columnar shape over a vertical length of the stopper member 38. The third damper 39 is provided on a lateral surface of the stopper member (on a side opposite to the first fixed stopper 36A). When the movable stopper 37 is at the movement restricting position, the third damper 39 is disposed in side-by-side (opposed) relation to the shaft 55 of the head unit 50 in the X-direction (see FIG. 5). The third damper 39 is not necessarily made of urethane, but may be a rubber member or a spring, as with the first and second dampers 53A, 53B.

A handle 41 is provided at an end of the movable stopper 37 on a side opposite to the stopper member 38 (on the side of a corresponding one of the component supply sections 11). A user or operator can push and pull the handle 41 while gripping it to manually move the arm 30 in the Y-axis direction.

When the movable stopper 37 is at the movement restricting position, the stopper member 38 is moved to protrude toward the inner side of the first fixed stopper 36A, so that the movable range of the head unit 50 is narrowed by a width dimension of the stopper member 38. On the other hand, when the movable stopper 37 is at the movement permitting position, the stopper member 38 is retracted from the inner side of the first fixed stopper 36A, so that the movable range of the head unit 50 is widened by the width dimension of the stopper member 38.

As for the movable range of the head unit 50, a restricted value is preliminarily set. The component mounting apparatus 10 according to this embodiment is configured such that, during a component mounting operation for picking up or mounting an electronic component by each of the suction nozzles 51 of the head unit 50, the movable stopper 37 is set at the movement restricting position, and the head unit 50 is moved between the second fixed stopper 36B and the movable stopper 37. The component mounting apparatus 10 is also configured such that, during a mark recognition operation for recognizing a mark by the mark recognition device 56 of the head unit 50, the movable stopper 37 is set at the movement permitting position, and the head unit 50 is moved between the second fixed stopper 36B and the first fixed stopper 36A. The movable range of the head unit 50 during the component mounting operation, and the movable range of the head unit 50 during the mark recognition operation, will hereinafter be referred to respectively as "normal movable range" and "extended movable range".

One end (first end) of the normal movable range (on the side of the base end of the arm 30) is positionally identical to that of the extended movable range. When the head unit 50 is moved closest to the first end, a lateral surface of the first damper 53A is disposed adjacent to the second fixed stopper 36B. In this process, the X-directional sliders 35 are moved into spaces above and below the frame 20, and the lateral surface of the head unit 50 is moved closer to the inner surface of the frame 20.

The other end (second end) of the normal movable range (on the side of the free end of the arm 30) is positionally different from that of the extended movable range. When the head unit 50 is moved closest to the second end of the normal movable range, the shaft 55 of the head unit 50 is moved close to the third damper 39 of the movable stopper 37. On the other hand, when the head unit 50 is moved closest to the second end of the extended movable range, the second damper 53B of the head unit 50 is moved close to the first fixed stopper 36A. The second damper 53B has an inclined surface formed in a corner thereof to have an inclination equal to that of an after-mentioned contact portion 42 of the movable stopper 37.

The movable stopper 37 has a contact portion 42 brought into contact with the shaft 55 of the head unit 50 when the movable stopper 37 is moved to the movement restricting position. The contact portion 42 is an inclined surface provided at a distal end of the stopper member 38 and formed such that a protruding dimension thereof toward the movable range of the head unit 50 gradually increases from the center to the X-directional rail 34 toward the free end.

One example of a process to be performed by the component mounting apparatus 10 will be described below. First of all, the mark recognition operation is performed. The common recognition mark of the base 12 is firstly recognized. This example will be described on an assumption that the common recognition mark of the base 12 is provided at a center of the base 12.

Figure 6:
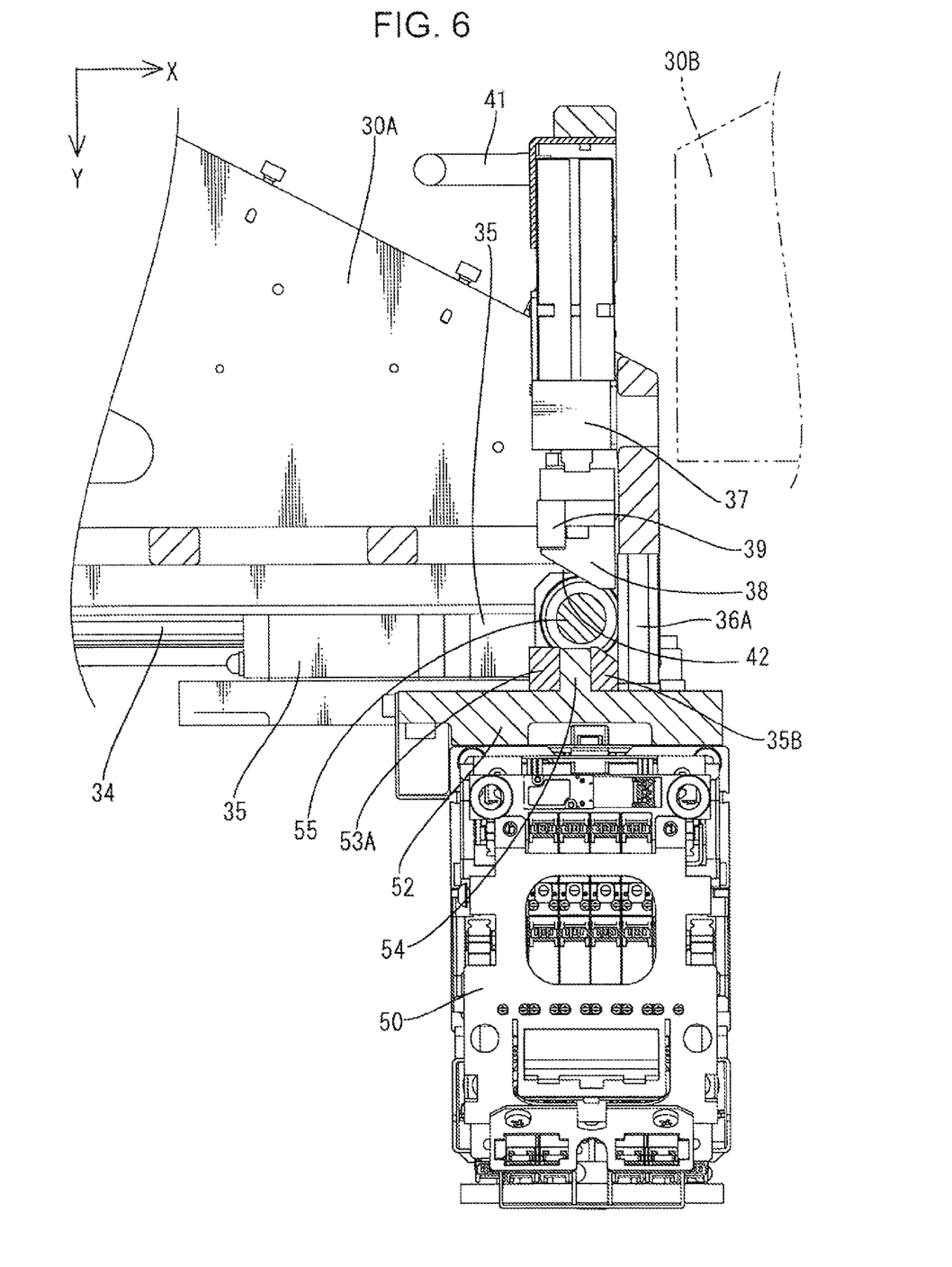
FIG. 6 is a sectional view illustrating a state in which the head unit is moved to an end of an X-directional rail.

The same common recognition mark is recognized by the two head units 50 provided in the pair of opposed arms 30A, 30B. The common-recognition-mark recognition operation is firstly performed by the head unit 50 provided in one 30A of the pair of opposed arms 30A, 30B. As illustrated in FIG. 6, during the common-recognition-mark recognition operation, the movable stopper 37 is set at the movement permitting position, so that the head unit 50 of the one arm (first arm) 30A can be moved within the extended movable range. On the other hand, in the other arm (second arm) 30B, the movable stopper 37 is set at the movement restricting position, so that the head unit 50 is disposed within the normal movable range.

Subsequently, the head unit 50 of the first arm 30A is moved to an end of the extended movable range. Then, the situation where the head unit 50 is set at the end of the extended movable range is recognized by a non-illustrated sensor provided in the arm 30A. In this state, a portion of the head unit 50 on the widthwise end thereof protrudes outwardly from the edge face of each of the X-directional rails 34, so that the end of the mark recognition device 56 reaches a position just above the common recognition mark. Then, an image of the common recognition mark of the base 12 is taken by the mark recognition device 56 to recognize the common recognition mark.

In the first arm 30A, after completion of image-taking of the common recognition mark, the movable stopper 37 is set at the movement restricting position, so that the movement of the head unit 50 is restricted within the normal movable range.

When the common-recognition-mark recognition operation by one of the head units 50 is completed in the above manner, the common-recognition-mark recognition operation by the other head unit 50 is started. The common-recognition-mark recognition operation by the other head unit 50 is performed in the same manner as that described above. In this process, the head unit 50 previously completing the common-recognition-mark recognition operation is disposed within the normal movable range, so that it becomes possible to avoid collision between the head unit 50 previously completing the common-recognition-mark recognition operation and the head unit 50 subsequently performing the common-recognition-mark recognition operation.

After the same common recognition mark is recognized by the mark recognition devices 56 provided in the head units 50, respective coordinates of the images of the common recognition mark are calculated, and a coordinate system in each of the head units 50 is corrected to allow the calculated coordinates to coincide with each other.

Figure 7:
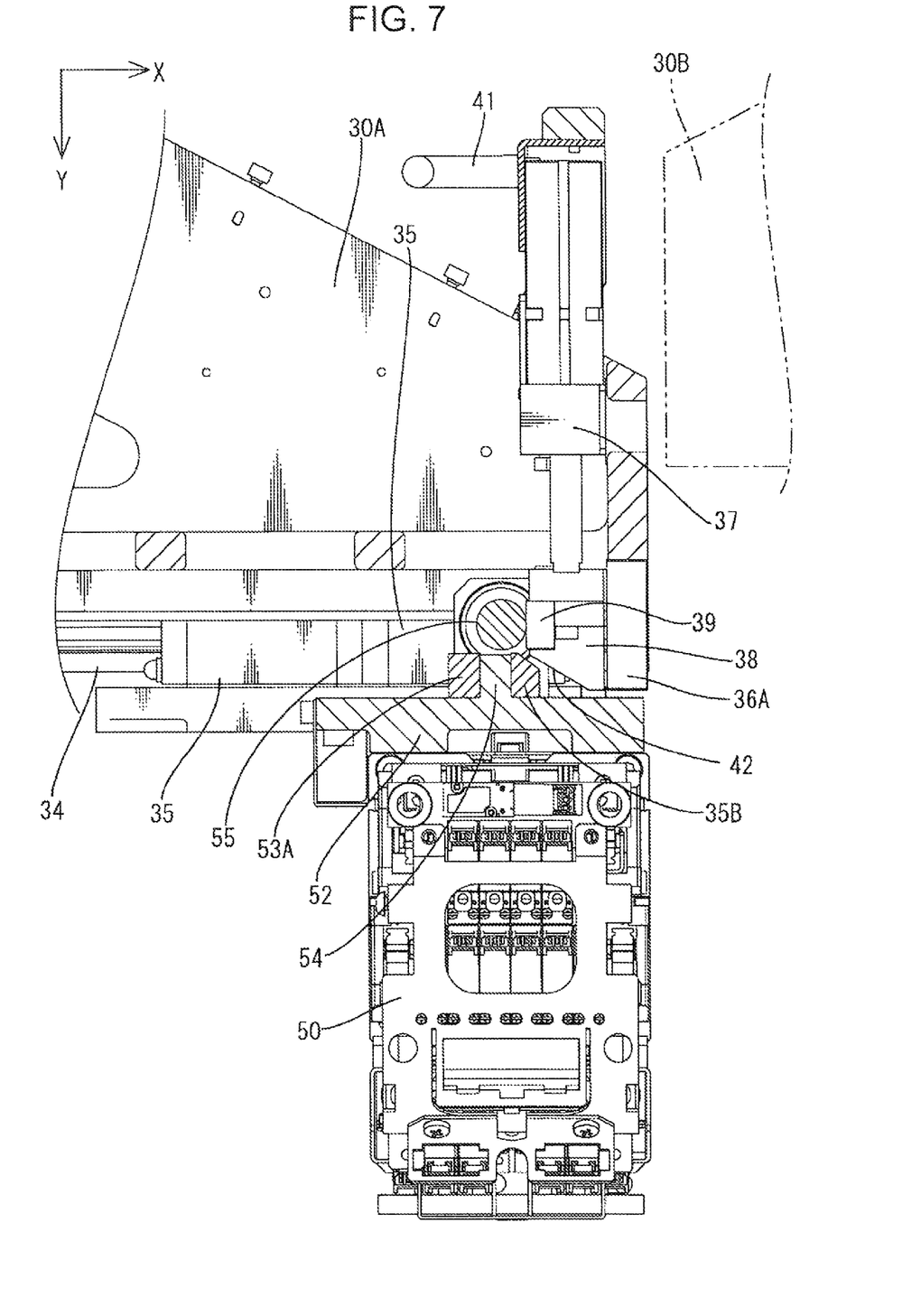
FIG. 7 is a sectional view illustrating a state in which the head unit is pushed back toward a center of the X-directional rail by the movable stopper.

Meanwhile, for example, if the openable and closable cover is opened during the course of the common-recognition-mark recognition operation, the component mounting apparatus 10 is subjected to emergency stop, in some cases. In this situation, as illustrated in FIG. 7, in the arm 30 during the common-recognition-mark recognition operation, the movable stopper 37 is moved to the movement restricting position, and brought into contact with the shaft 55 of the head unit 50 set at the end of the extended movable range to push back the shaft 55 toward the center of each of the X-directional rails 34. Consequently, the head unit 50 is disposed within the normal movable range. This makes it possible to avoid a situation where the head unit 50 collides with its surroundings, for example, when an operator manually moves the arm 30. When the movable stopper 37 pushes back the shaft 55, the shaft 55 is rotated to facilitate the pushing-back operation.

Then, the reference mark of a board is recognized. Each of the head units 50 recognizes a fixed position of the board by recognizing the reference mark of the board. In the case where the reference mark of the board is located at the center of the base 12 (in a region to be a dead space as the head unit 50 disposed within the normal movable range), the reference-mark recognition operation is performed under the condition that the movable stopper 37 is set at the movement permitting position, and the head unit 50 is moved to the end of the extended movable range, in the same manner as that during the common-recognition-mark recognition operation.

Then, a component mounting operation is performed. Each of the head units 50 corrects a mounting position of an electronic component, based on the fixed position of the board, and then mounts the electronic component onto the board. During the component mounting operation, the movable stopper 37 is set at the movement restricting position, so that the head unit 50 is moved within the normal movable range. The situation where the movable stopper 37 is set at the movement restricting position is recognized by a non-illustrated sensor provided in the arm 30A.

The component mounting apparatus 10 is configured such that, if the head unit 50 almost collides with the first fixed stopper 36A, the second fixed stopper 36B or the movable stopper 37, during the mark recognition operation or the component mounting operation, a sensor provided in the arm 30 detects the situation to turn off power of the servomotor 33.

The component mounting apparatus 10 according to the above embodiment has the following advantageous effects. The component mounting apparatus 10 according to the above embodiment includes the head unit 50 for performing an operation of mounting electronic components onto a board, and the arm 30 for moving the head unit 50 in the X-direction. The arm 30 includes the X-directional rail 34 and the X-directional slider 35 moved along the X-directional rail 34. The head unit 50 is fixed to the X-directional slider 35 in such a manner that at least a portion of the head unit 50 protrudes outwardly from the edge face 35A of the X-directional slider 35 oriented in a moving direction thereof.

Thus, when the X-directional slider 35 is moved to the free end of the X-directional rail 34, a portion of the head unit 50 protrudes outwardly from the edge face of the X-directional rail 34. In addition, the arm 30 is a single-tiered type in which the X-directional slider 35 is moved with respect to the X-directional rail 34, so that the head unit 50 can be moved to a position where it protrudes outwardly from the edge face of the X-directional rail 34, without a need for complicate control.

The arm 30 is provided in a pair, i.e., as the pair of opposed arms 30A, 30B aligned in the X-direction. The opposed arm 30A includes the X-directional rail 34 (first guide rail) having an edge face on the side of a free end of the opposed arm 30A (first edge face), and the X-directional slider 35 (first sliding member) being movable along the X-directional rail 34. Similarly, the opposed arm 30B includes the X-directional rail 34 (second guide rail) having an edge face on the side of a free end of the opposed arm 30B (second edge face), and the X-directional slider 35 (second sliding member) being movable along the X-directional rail 34. The opposed arms 30A, 30B are arranged in a paired manner in the X-direction, in such a manner that the edge face of the X-directional rail 34 of the opposed arm 30A (first edge face) and the edge face of the X-directional rail 34 of the opposed arm 30B (second edge face) are in opposed relation to each other. The head unit 50 to be moved by the opposed arm 30A is fixed to the X-directional slider 35 in such a manner that at least a portion of the head unit 50 protrudes from the edge face 35A of the X-directional slider 35 (first sliding member) toward the edge face of the X-directional rail 34 of the opposed arm 30B (second edge face). Further, the head unit 50 to be moved by the opposed arm 30B is fixed to the X-directional slider 35 in such a manner that at least a portion of the head unit 50 protrudes from the edge face 35A of the X-directional slider 35 (second sliding member) toward the edge face of the X-directional rail 34 of the opposed arm 30A (first edge face). Thus, when the X-directional slider 35 is moved to the free end of the X-directional rail 34, a portion of the head unit 50 protrudes between the edge face of the X-directional rail 34 of the opposed arm 30A (first edge face) and the edge face of the X-directional rail 34 of the opposed arm 30B (second edge face), so that it becomes possible to prevent a region therebetween from becoming a dead space.

The component mounting apparatus 10 includes the frame 20 disposed on the side of the base end (one end) of the X-directional rail 34 in approximately orthogonal relation to the X-directional rail 34, wherein the X-directional rail 34 extends across the inner surface of the frame 20. In the case where the X-directional rail is ended just before the inner surface of the frame without extending across the inner surface, the movable range of the head unit is limited to a position just before the frame. Differently, in the above embodiment, the X-directional rail 34 extends across the inner surface of the frame 20, so that it becomes possible to move the head unit 50 over a wider range. Thus, even though the head unit 50 is fixed to the X-directional slider 35 at a position offset toward a side opposite to the frame 20, it becomes possible to prevent the offset from causing an increase in dead space on the side of the frame 20.

The arm 30 has the movable stopper 37 being movable between the movement restricting position where it protrudes into the movable range of the head unit 50 to restrict the movement of the head unit 50, and the movement permitting position where it is retracted from the movable range of the head unit 50 to permit the movement of the head unit 50. Thus, the movable range of the head unit 50 can be appropriately changed by moving the movable stopper 37.

The movable stopper 37 is moved, when the operation for the board is stopped, to the movement restricting position and brought into contact with the head unit 50 located at the end of the X-directional rail 34, so that the head unit 50 is pushed back toward the center of the X-directional rail 34. This makes it possible to prevent the head unit 50 from colliding with its surroundings, for example, when an operator manually moves the arm 30 in the event of stop of the operation for the board.

The contact portion 42 provided in the movable stopper 37 and brought into contact with the shaft 55 of the head unit 50 is formed as an inclined surface whose protruding dimension toward the movable range of the head unit gradually increases from the center to the end of the X-directional rail 34. This allows the movable stopper 37 to smoothly push back the head unit 50 toward the center of the X-directional rail 34.

<Other Embodiments>

It is to be understood that the present invention is not limited to the above embodiment described with reference to the drawings. For example, the following embodiments are also included in the technical scope of the present invention.

(1) The above embodiment has been described based on an example in which the present invention is applied to the component mounting apparatus 10 for mounting electronic components onto a board. In addition to the component mounting apparatus 10, the present invention can be widely applied to various other types of board processing apparatuses for performing some processing for a board by using a head unit 50.

(2) The above embodiment has been described based on an example in which the present invention is applied to the component mounting apparatus 10 provided with the plurality of head units 50. Alternatively, the present invention may be applied, for example, to a component mounting apparatus provided with one head unit.

(3) The above embodiment has been described based on an example in which the arm 30 is supported by the frame 20 in a cantilever manner. Alternatively, the arm may be, for example, a type which is suspended from a ceiling portion of the component mounting apparatus.

(4) The above embodiment has been described based on an example in which the head unit 50 protrudes from the one edge face 35A of the X-directional slider 35. Alternatively, the head unit 50 may protrude from respective opposite edge faces of the X-directional slider 35 in opposite directions.

(5) The above embodiment has been described based on an example in which the component mounting apparatus 10 is configured such that, during the component mounting operation, the movable stopper 37 is set at the movement restricting position, and the head unit 50 is moved within the normal movable range. Alternatively, the component mounting apparatus may be configured such that, even during the component mounting operation, the movable stopper 37 is set at the movement permitting position, and the head unit 50 is moved within the extended movable range. This makes it possible to mount an electronic component onto a region of a board located at a center of the base due to a size, etc., of the board, or suction-hold an electronic component from a region located at a center of the base.

(6) The above embodiment has been described based on an example in which, when the operation for a board is stopped, the movable stopper 37 is moved to the movement restricting position and brought into contact with the head unit 50 located at the end of the X-directional rail 34, so that the head unit 50 is pushed back toward the center of the X-directional rail 34. Alternatively, the movable stopper 37 may be configured to be brought into contact with the X-directional slider to push back the X-directional slider toward the center of the X-directional rail, thereby pushing back the head unit.

(7) The above embodiment has been described based on an example in which the contact portion 42 of the movable stopper 37 is formed as an inclined surface. Alternatively, for example, the inclined surface may be provided on the head unit. Further, the inclined surface may be provided on both the movable stopper 37 and the head unit.

(8) The above embodiment has been described based on an example in which the movable stopper 37 is provided only at the end of the arm 30. Alternatively, a plurality of movable stoppers may be provided at respective positions to allow the movable range of the head unit to be changed in a multi-step manner.

The above specific embodiments primarily include the inventions having the following features. According to one aspect of the present invention, there is provided a board processing apparatus which includes: a head unit for performing a predetermined operation for a board; and a moving device for moving the head unit in a uniaxial direction, wherein the moving device includes a guide rail and a sliding member that is moved along the guide rail, and wherein the head unit is fixed to the sliding member in such a manner that at least a portion of the head unit protrudes outwardly from an edge face of the sliding member oriented in a moving direction thereof.

In the board processing apparatus, when the sliding member is moved to an end of the guide rail, at least a portion of the head unit protrudes outwardly from the edge face of the guide rail. In addition, the moving device is a single-tiered type in which the sliding member is moved, so that the head unit can be moved to a position where it protrudes outwardly from the edge face of the guide rail, without a need for complicate control.

Preferably, in the board processing apparatus of the present invention, the moving device includes a first moving device which includes a first guide rail having a first edge face, and a first sliding member, and a second moving device which includes a second guide rail having a second edge face, and a second sliding member, wherein the first and second moving devices are arranged such that the first edge face and the second edge face are in opposed relation to each other; a head unit to be moved by the first moving device is fixed to the first sliding member in such a manner that at least a portion of the head unit protrudes from an edge face of the first sliding member toward the second edge face; and a head unit to be moved by the second moving device is fixed to the second sliding member in such a manner that at least a portion of the head unit protrudes from an edge face of the second sliding member toward the first edge face.

According to this feature, when the first sliding member or the second sliding member is moved to the first edge face of the first guide rail or the second edge face of the second guide rail, a portion of the head unit to be moved by the first moving device or the second moving device protrudes between the first edge face and the second edge face, so that it becomes possible to prevent a region therebetween from becoming a dead space.

The board processing apparatus of the present invention may further includes a frame disposed on the side of one end of the guide rail in approximately orthogonal relation to the guide rail, wherein the guide rail extends across a lateral surface of the frame. In the case where the guide rail is ended just before the lateral surface of the frame without extending across the lateral surface, the movable range of the head unit is limited to a position just before the frame. Differently, according to the above feature, the guide rail extends across the lateral surface of the frame, so that it becomes possible to move the head unit over a wider range.

Preferably, the board processing apparatus of the present invention further comprises a frame disposed on the side of one end of the guide rail in approximately orthogonal relation to the guide rail, wherein the moving device is supported by the frame in a cantilever manner, and the head unit is fixed to the sliding member in such a manner that at least a portion of the head unit protrudes from an edge face of the sliding member on a side opposite to an edge face thereof on the side of the frame.

According to this feature, a portion of the head unit can be disposed to protrude from an edge face of the guide rail on the side of a free end of the moving device supported by the frame in a cantilever manner. Thus, it becomes possible to eliminate a dead space around the head unit, on the side of the free end of the moving device.

In the board processing apparatus of the present invention, the moving device may include a movable stopper that is movable between a movement restricting position where it protrudes into a movable range of the sliding member or the head unit to restrict the movement of the sliding member or the head unit, and a movement permitting position where it is retracted from the movable range of each of the sliding member and the head unit to permit the movement of each of the sliding member and the head unit.

According to this feature, the movable range of the head unit can be appropriately changed by moving the movable stopper.

The movable stopper may be provided at an end of the guide rail, wherein the movable stopper may be moved, when the predetermined operation for the board is stopped, to the movement restricting position and brought into contact with the sliding member or the head unit located at the end of the guide rail, so that the sliding member or the head unit is pushed back toward a center side of the guide rail.

According to this feature, when the predetermined operation for the board is stopped, the head unit is retracted toward the center of the guide rail. Thus, for example, even when an operator manually moves the moving device, it becomes possible to prevent the head unit from colliding with its surroundings.

Preferably, the movable stopper has a contact portion that is brought into contact with the sliding member or the head unit, wherein the contact portion is an inclined surface whose protruding dimension toward the movable range of the sliding member or the head unit gradually increases from the center to the end of the guide rail.

According to this feature, the sliding member or the head unit can be smoothly pushed back toward the center of the guide rail by the movable stopper.

Preferably, in the board processing apparatus of the present invention, the sliding member is movable along the guide rail over its entire length to an extent that the edge face of the sliding member oriented in the moving direction does not protrude from an edge face of the guide rail, wherein a portion of the head unit protrudes outwardly from the edge face of the guide rail when the edge face of the sliding member oriented in the moving direction is moved to a position of the edge face of the guide rail. According to this feature, it becomes possible to allow a portion of the head unit to reliably protrude outwardly from the edge face of the guide rail.

More preferably, in the above board processing apparatus, the head unit includes a plurality of suction nozzles, and a widthwise central position of the head unit is fixed to a vicinity of an end of the sliding member, and wherein a part of the suction nozzles of the head unit protrudes outwardly from the edge face of the guide rail when the edge face of the sliding member oriented in the moving direction is moved to a position of the edge face of the guide rail. According to this feature, the operation in a dead space can be performed using a part of the suction nozzles of the head unit protruding outwardly from the edge face of the guide rail.

As mentioned above, the present invention can provide a board processing apparatus capable of moving a head unit to a position where it protrudes outwardly from an edge face of a guide rail, without a need for complicate control.

This application is based on Japanese Patent application No. 2012-004219 filed in Japan Patent Office on Jan. 12, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A board processing apparatus comprising:
   a head unit for performing a predetermined operation for a board; and
   a moving device for moving the head unit in a uniaxial direction, the moving device including a guide rail having one end and other end and a sliding member that is moved along the guide rail between the one end and the other end,
   wherein the head unit is fixed to the sliding member in such a manner that at least a portion of the head unit protrudes outwardly from an edge face of the sliding member oriented in a moving direction thereof, the edge face being an edge face facing to the one end or the other end of the guide rail, and the portion of the head unit protrudes outwardly from the first end or the second end of the guide rail in a direction in which the guide rail extends when the edge face is moved to a position of the first end or the second end of the guide rail.

2. The board processing apparatus as defined in claim 1, wherein:
   the moving device includes a first moving device which includes a first guide rail having a first edge face, and a first sliding member, and a second moving device which includes a second guide rail having a second edge face, and a second sliding member, wherein the first and second moving devices are arranged such that the first edge face and the second edge face are in opposed relation to each other;
   a head unit to be moved by the first moving device is fixed to the first sliding member in such a manner that at least a portion of the head unit protrudes from an edge face of the first sliding member toward the second edge face; and
   a head unit to be moved by the second moving device is fixed to the second sliding member in such a manner that at least a portion of the head unit protrudes from an edge face of the second sliding member toward the first edge face.

3. The board processing apparatus as defined in claim 1, which further comprises a frame disposed on the side of one end of the guide rail in approximately orthogonal relation to the guide rail, wherein the guide rail extends across a lateral surface of the frame.

4. The board processing apparatus as defined in claim 1, which further comprises a frame disposed on the side of one end of the guide rail in approximately orthogonal relation to the guide rail, wherein the moving device is supported by the frame in a cantilever manner, and the head unit is fixed to the sliding member in such a manner that at least a portion of the head unit protrudes from an edge face of the sliding member on a side opposite to an edge face thereof on the side of the frame.

5. The board processing apparatus as defined in claim 1, wherein the moving device includes a movable stopper that is movable between a movement restricting position where it protrudes into a movable range of the sliding member or the head unit to restrict the movement of the sliding member or the head unit, and a movement permitting position where it is retracted from the movable range of each of the sliding member and the head unit to permit the movement of each of the sliding member and the head unit.

6. The board processing apparatus as defined in claim 5, wherein the movable stopper is provided at an end of the guide rail, and wherein the movable stopper is moved, when the predetermined operation for the board is stopped, to the movement restricting position and brought into contact with the sliding member or the head unit located at the end of the guide rail, so that the sliding member or the head unit is pushed back toward a center side of the guide rail.

7. The board processing apparatus as defined in claim 6, wherein the movable stopper has a contact portion that is brought into contact with the sliding member or the head unit, the contact portion being an inclined surface whose protruding dimension toward the movable range of the sliding member or the head unit gradually increases from the center to the end of the guide rail.

8. The board processing apparatus as defined in claim 1, wherein the sliding member is movable along the guide rail over its entire length to an extent that the edge face of the sliding member oriented in the moving direction does not protrude from an edge face of the guide rail, and wherein a portion of the head unit protrudes outwardly from the edge face of the guide rail when the edge face of the sliding member oriented in the moving direction is moved to a position of the edge face of the guide rail.

9. The board processing apparatus as defined in claim 8, wherein the head unit includes a plurality of suction nozzles, and a widthwise central position of the head unit is fixed to a vicinity of an end of the sliding member, and wherein a part of the suction nozzles of the head unit protrudes outwardly from the edge face of the guide rail when the edge face of the sliding member oriented in the moving direction is moved to a position of the edge face of the guide rail.

* * * * *